United States Patent
Lee et al.

(10) Patent No.: US 9,972,400 B1
(45) Date of Patent: May 15, 2018

(54) NONVOLATILE MEMORY DEVICE AND CALIBRATION METHOD FOR THE SAME

(71) Applicant: INSTON INC., Los Angeles, CA (US)

(72) Inventors: Albert Lee, Los Angeles, CA (US); Hochul Lee, Los Angeles, CA (US); Kang-Lung Wang, Los Angeles, CA (US)

(73) Assignee: INSTON INC., Los Angeles, CA (US)

( * ) Notice: Subject to any disclaimer, the term of this patent is extended or adjusted under 35 U.S.C. 154(b) by 0 days. days.

(21) Appl. No.: 15/683,775

(22) Filed: Aug. 22, 2017

(51) Int. Cl.
| | |
|---|---|
| H03M 1/10 | (2006.01) |
| G11C 16/34 | (2006.01) |
| G11C 7/10 | (2006.01) |
| G11C 7/08 | (2006.01) |
| G11C 16/28 | (2006.01) |
| G11C 29/12 | (2006.01) |
| G11C 29/02 | (2006.01) |

(52) U.S. Cl.
CPC ............ *G11C 16/3459* (2013.01); *G11C 7/08* (2013.01); *G11C 7/1006* (2013.01); *G11C 7/1045* (2013.01); *G11C 16/28* (2013.01); *G11C 29/028* (2013.01); *G11C 29/1201* (2013.01); *G11C 2029/1202* (2013.01)

(58) Field of Classification Search
CPC ... G11C 16/3459; G11C 16/28; G11C 29/028; G11C 29/1201; G11C 7/08; G11C 7/1006; G11C 7/1045

USPC .......................................................... 341/120
See application file for complete search history.

(56) References Cited

U.S. PATENT DOCUMENTS

| | | | | |
|---|---|---|---|---|
| 4,195,349 A | * | 3/1980 | Balkanli ................. | E21B 47/06 374/143 |
| 5,736,848 A | * | 4/1998 | De Vries .............. | G01R 21/133 324/142 |
| 2005/0077976 A1 | * | 4/2005 | Cohen ................. | H04L 25/4902 332/112 |
| 2005/0078018 A1 | * | 4/2005 | Cohen ..................... | H03M 5/08 341/53 |
| 2005/0078021 A1 | * | 4/2005 | Cohen ..................... | H03M 5/08 341/68 |
| 2007/0001823 A1 | * | 1/2007 | Der .......................... | H03B 5/32 340/384.1 |
| 2012/0044000 A1 | * | 2/2012 | Hsieh ..................... | H03K 3/011 327/156 |
| 2017/0330602 A1 | * | 11/2017 | Zhou ..................... | G11C 5/147 |

\* cited by examiner

*Primary Examiner* — Lam T Mai
(74) *Attorney, Agent, or Firm* — Li & Cai Intellectual Property (USA) Office

(57) ABSTRACT

The present disclosure provides a calibration method for a nonvolatile memory device having a plurality of unit cells, each of the unit cells corresponding to a word line and a bit line of the nonvolatile memory device. The calibration method includes: calibrating a word signal pulse of each of the word lines with a first calibration value corresponding to the word line; calibrating a bit signal pulse of each of the bit lines with a second calibration value corresponding to the bit line; and calibrating each of the unit cells according to the word line and the bit line corresponding to the unit cell.

16 Claims, 5 Drawing Sheets

| +2 | +3 | +3 |
|----|----|----|
| +1 | +2 | +1 |
| +1 | +0 | +2 |

| +1 | +1 | +1 |
|----|----|----|
| +0 | +0 | -1 |
| +0 | -2 | +0 |

| +0 | +0 | +0 |
|----|----|----|
| +0 | +0 | -1 |
| +0 | -2 | +0 |

NONVOLATILE MEMORY DEVICE AND CALIBRATION METHOD FOR THE SAME

FIELD OF THE INVENTION

The present disclosure relates to a nonvolatile memory device, and more particularly to a nonvolatile memory device and a calibration method thereof.

BACKGROUND OF THE INVENTION

A nonvolatile memory device within a particular macro may have different optimal programming conditions, such as programming time, voltage, current, etc., based on variation and location. To optimize the nonvolatile memory device, calibration is often used to address these variation issues, and achieved by changing the conditions along a column/row.

Referring to FIG. 1, FIG. 1 shows waveforms of calibration of writing time of a nonvolatile memory device according to a prior art. Time points $T_{w,\ start}$ and $T_{w,\ end}$ in FIG. 1 are respectively a start time and an end time of a bit signal pulse $W_{col}$, and a difference between the time points $T_{w,\ start}$ and $T_{w,\ end}$ equals $t_{write}$, representing a period of writing the nonvolatile memory device. For a particular programming condition, the bit signal pulse $W_{col}$ is calibrated with a $t_{cal}$, and then the period of writing the nonvolatile memory device is changed from $t_{write}$ to $t_{write}+t_{cal}$, as indicated by the dotted waveform shown in FIG. 1.

Referring to FIG. 2, FIG. 2 shows waveforms of calibration of voltage of a nonvolatile memory device according to a prior art. Similar to FIG. 1, voltages $V_{WL}$ and $V_{BL}$ in FIG. 2 respectively are voltage of a word/bit signal pulse. For a particular programming condition, the bit signal pulse $W_{col}$ is calibrated with a $V_{cal}$, and then the voltage of writing the nonvolatile memory device is changed from $V_{BL}$ to $V_{BL}+V_{cal}$ for each column, as indicated by the dotted waveform shown in FIG. 2.

Referring to FIG. 5, FIG. 5 shows a diagram of cell units of a nonvolatile memory device according to an embodiment of the present invention, each block in FIG. 5 represents a difference value from the optimal writing time, such as in the top row, the difference values are +2, +3, +3, that is, the differences between the writing time now and the optimal writing time are +2, +3, +3 time units respectively.

After being calibrated in the column direction, as shown in FIG. 6, with calibration values of −1, −2, −2 from left to right, the top row now has differences from the optimal writing times being +1, +1, +1 time units respectively, while the two rows below have differences of 0, 0, −1, and 0, −2, 0 respectively.

However, the calibration along the column direction may not adjust the writing time efficiently and accurately enough for the optimal programming condition. Thus, a nonvolatile memory device and calibration method thereof providing more efficient calibration for optimal programming conditions is needed to improve programming performance.

SUMMARY OF THE INVENTION

One aspect of the present disclosure relates to a calibration method for a nonvolatile memory device having a plurality of unit cells, each of the unit cells corresponding to a word line and a bit line of the nonvolatile memory device, the calibration method including: calibrating a word signal pulse of each of the word lines with a first calibration value corresponding to the word line; calibrating a bit signal pulse of each of the bit lines with a second calibration value corresponding to the bit line; and calibrating each of the unit cells according to the word line and the bit line corresponding to the unit cell.

One of the embodiments of the present disclosure provides the calibration method, wherein the first calibration value is a first time variation value, and the second calibration value is a second time variation value.

Another one of the embodiments of the present disclosure provides the calibration method, wherein the step of calibrating each of the unit cells according to the word line and the bit line corresponding to the unit cell includes: determining a start time of writing the unit cell by a start of the word signal pulse of the word line; and determining an end time of writing the unit cell by an end of the bit signal pulse of the bit line. The start of the word signal pulse of the word line is calibrated by the first calibration value, and the end of the bit signal pulse of the bit line is calibrated by the second time variation value.

Yet another one of the embodiments of the present disclosure provides the calibration method, wherein the step of calibrating each of the unit cells according to the word line and the bit line corresponding to the unit cell includes: determining a start time of writing the unit cell by a start of the bit signal pulse of the bit line; and determining an end time of writing the unit cell by an end of the word signal pulse of the word line. The start of the bit signal pulse of the bit line is calibrated by the first calibration value, and the end of the word signal pulse of the word line is calibrated by the second time variation value.

Yet another one of the embodiments of the present disclosure provides the calibration method, wherein the first calibration value is a first voltage variation value, and the second calibration value is a second voltage variation value.

Yet another one of the embodiments of the present disclosure provides the calibration method, wherein the step of calibrating each of the unit cells according to the word line and the bit line corresponding to the unit cell includes: determining a voltage of the unit cell by a word signal voltage and a bit signal voltage. The word signal voltage is calibrated with the first calibration value, and the bit signal voltage is calibrated with the second calibration value.

Yet another one of the embodiments of the present disclosure provides the calibration method, wherein the first calibration value is a first current variation value, and the second calibration value is a second current variation value.

Yet another one of the embodiments of the present disclosure provides the calibration method, wherein the step of calibrating each of the unit cells according to the word line and the bit line corresponding to the unit cell includes: determining a current of the unit cell by a word signal current and a bit signal current. The word signal current is calibrated with the first calibration value, and the bit signal current is calibrated with the second calibration value.

Another aspect of the present disclosure relates to a nonvolatile memory device including a plurality of unit cells, each of the unit cells including: a word line having a word signal pulse calibrated with a first calibration value corresponding to the word line; and a bit line having a bit signal pulse calibrated with a second calibration value corresponding to the bit line. Each of the unit cells is calibrated according to the word line and the bit line of the unit cell.

Therefore, the calibration method of the present invention through calibrating along both the column and row directions may provide more efficient and accurate adjustment for the optimal programming condition, that is, the calibration method of each unit cell in a nonvolatile memory device is the combination of the calibration along the row and that along the column.

To further understand the techniques, means and effects of the present disclosure, the following detailed descriptions and appended drawings are hereby referred to, such that, and through which, the purposes, features and aspects of the present disclosure can be thoroughly and concretely appreciated. However, the appended drawings are provided solely for reference and illustration, without any intention to limit the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

FIG. 5 shows a diagram of cell units of a nonvolatile memory device according to an embodiment of the present invention;

FIG. 6 shows a diagram of the cell units of FIG. 5 after calibration by the method of FIG. 1;

FIG. 7 shows a diagram of the cell units of FIG. 5 after calibration by the method of FIG. 3;

DETAILED DESCRIPTION OF THE PREFERRED EMBODIMENTS

Embodiments of the present disclosure are described herein. Other advantages and objectives of the present disclosure can be easily understood by one skilled in the art from the disclosure. The present disclosure can be applied in different embodiments. Various modifications and variations can be made to various details in the description for different applications without departing from the scope of the present disclosure. The drawings of the present disclosure are provided only for simple illustrations, but are not drawn to scale and do not reflect the actual relative dimensions. The following embodiments are provided to describe in detail the concept of the present disclosure, and are not intended to limit the scope thereof in any way.

Figure 1:
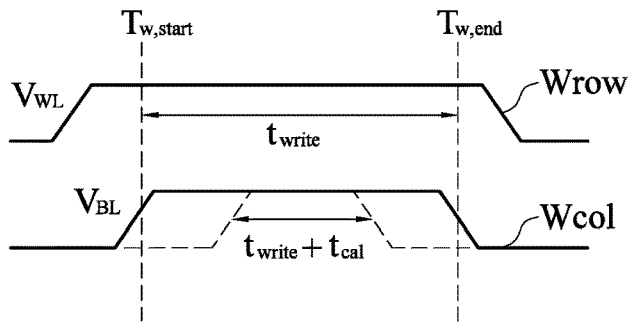
FIG. 1 shows waveforms of calibration of writing time of a nonvolatile memory device according to a prior art.
Figure 2:
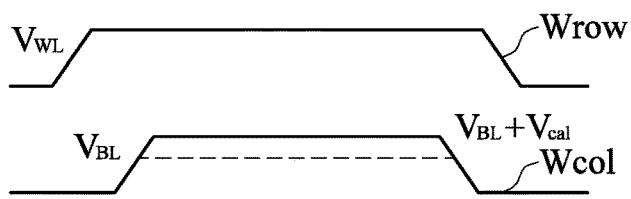
FIG. 2 shows waveforms of calibration of voltage of a nonvolatile memory device according to a prior art.
Figure 3:
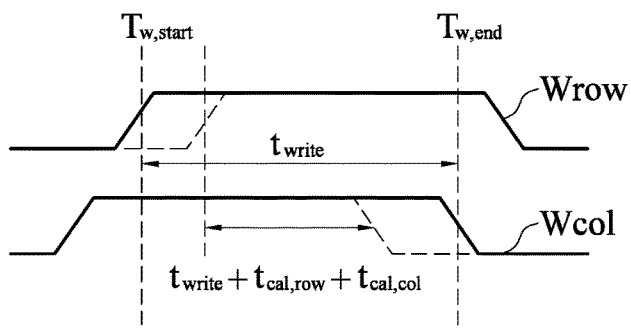
FIG. 3 shows waveforms of calibration of writing time of a nonvolatile memory device according to an embodiment of the present invention.

Referring to FIG. 3, FIG. 3 shows waveforms of calibration of writing time of a nonvolatile memory device according to an embodiment of the present invention. Time points $T_{w,\ start}$ and $T_{w,\ end}$ in FIG. 3, similar to FIG. 1, are respectively a start time and an end time of a bit signal pulse $W_{col}$, and a difference between the time points $T_{w,\ start}$ and $T_{w,\ end}$ equals $t_{write}$, representing a period of writing the nonvolatile memory device. For a particular programming condition, the bit signal pulse $W_{col}$ is calibrated with a $t_{cal,\ col}$, the word signal pulse $W_{row}$ is calibrated with a $t_{cal,\ row}$, and then the period of writing the nonvolatile memory device is changed from $t_{write}$ to $t_{write}+t_{cal,\ col}+t_{cal,\ row}$, as indicated by the dotted waveform shown in FIG. 3. Referring to FIG. 5, FIG. 5 shows a diagram of cell units of a nonvolatile memory device according to an embodiment of the present invention. Each block in FIG. 5 represents a difference value from the optimal writing time, such as in the top row, the difference values are +2, +3, +3, that is, the differences between the writing time now and the optimal writing time are +2, +3, +3 time units respectively. Referring to FIG. 7, FIG. 7 shows a diagram of the cell units of FIG. 5 after calibration by the method of FIG. 3, as shown in FIG. 7, with calibration values of −1, −2, −2 from left to right, and −1, 0, 0 from top to bottom, the differences between the top row now and the optimal writing time being 0, 0, 0 time units respectively, while the two rows below have differences of 0, 0, −1, and 0, −2, 0 respectively.

Figure 8:
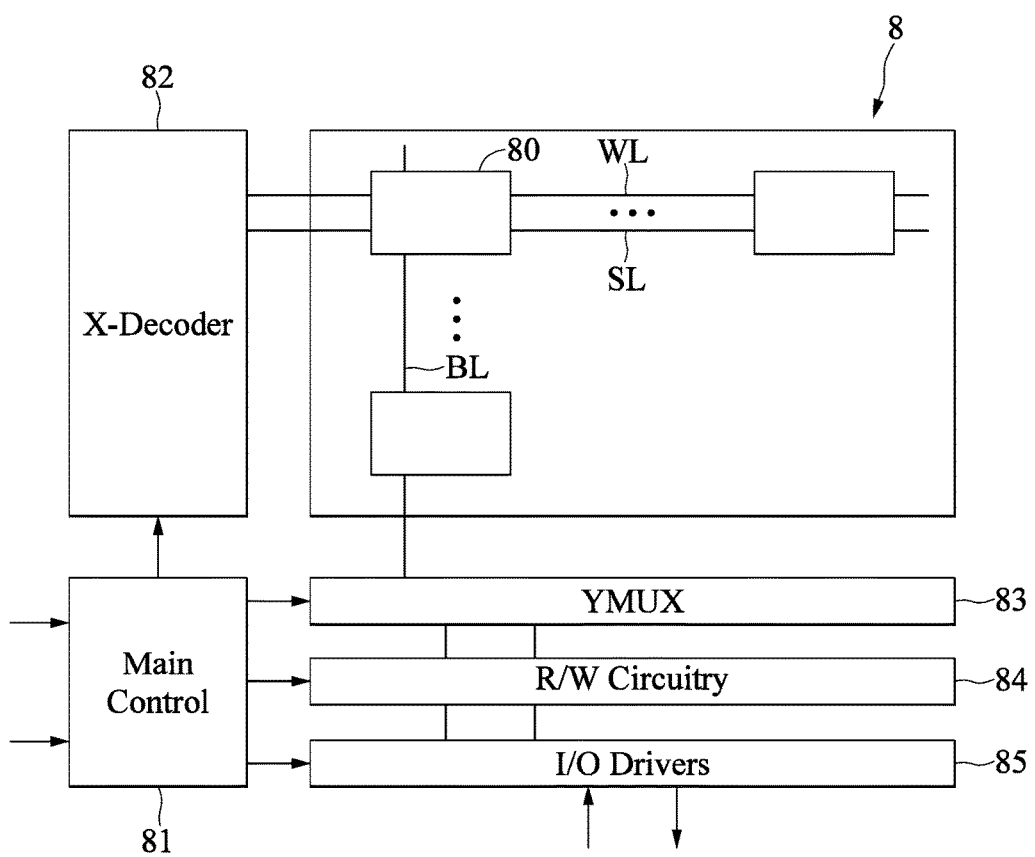
FIG. 8 shows a block diagram of a nonvolatile memory device according to an embodiment of the present invention.
Figure 10:
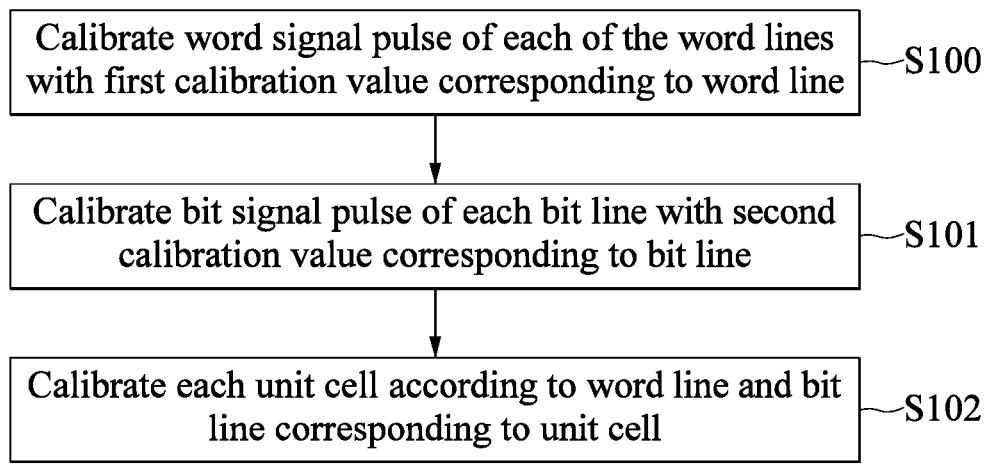
FIG. 10 shows a flowchart of a calibration method according to an embodiment of the present invention.

Referring to FIG. 8 and FIG. 10, FIG. 8 shows a block diagram of a nonvolatile memory device 8 according to an embodiment of the present invention, FIG. 10 shows a flowchart of a calibration method according to an embodiment of the present invention. The calibration method in FIG. 10 may be used by the nonvolatile memory device 8 in FIG. 8, the nonvolatile memory device 8 has a plurality of unit cells 80, a main controller 81, an X-decoder 82, a multiplexer 83, a write/read circuit 84, and an I/O driver 85, each of the unit cells 80 corresponds to a word line WL and a bit line BL of the nonvolatile memory device 8. The calibration method in FIG. 10 includes the following steps: S100: calibrating a word signal pulse of each of the word lines WL with a first calibration value corresponding to the word line WL; S101: calibrating a bit signal pulse of each of the bit lines BL with a second calibration value corresponding to the bit line BL; and S102: calibrating each of the unit cells 80 according to the word line WL and the bit line BL corresponding to the unit cell.

In the embodiment of FIG. 3, the first calibration value is the first time variation value $t_{cal,\ row}$, and the second calibration value is a second time variation value $t_{cal,\ col}$. The step S102 thus includes: determining a start time of writing the unit cell 80 by a start $T_{w,\ start}$ of the word signal pulse WOW of the word line WL; and determining an end time of writing the unit cell by an end $T_{w,\ end}$ of the bit signal pulse $W_{col}$ of the bit line BL. The start of the word signal pulse $W_{row}$ of the word line is calibrated by the first calibration value t cal, row, and the end of the bit signal pulse $W_{col}$ of the bit line is calibrated by the second time variation value $t_{cal,\ col}$. It should be noted that, in other embodiments, step S102 may be determining a start time of writing the unit cell 80 by a start $T_{w,\ start}$ of the bit signal pulse $W_{col}$ of the bit line BL; and determining an end time of writing the unit cell by an end $T_{w,\ end}$ of the word signal pulse $W_{row}$ of the word line WL. The start of the bit signal pulse $W_{col}$ of the bit line is calibrated by the first calibration value $t_{cal,\ row}$, and the end of the word signal pulse $W_{row}$ of the word line is calibrated by the second time variation value teal, eel.

Figure 4:
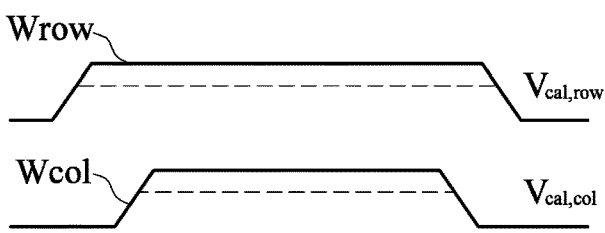
FIG. 4 shows waveforms of calibration of voltage of a nonvolatile memory device according to an embodiment of the present invention.

Referring to FIG. 4, FIG. 4 shows waveforms of calibration of voltages of a nonvolatile memory device according to an embodiment of the present invention. Similar to FIG. 3, voltages $V_{WL}$ and $V_{BL}$ in FIG. 4 are respectively voltages of a word/bit signal pulse. For a particular programming condition, the bit signal pulse $W_{col}$ is calibrated with a $V_{cal,\ col}$, the word signal pulse $W_{row}$ is calibrated with a $V_{cal, row}$, and then the voltage of writing the nonvolatile memory device is changed from $V_{WL}$ and $V_{BL}$ to $V_{BL}+V_{cal, row}$ and $V_{cal, col}$ respectively, as indicated by the dotted waveform shown in FIG. 4.

In the embodiment of FIG. 4, the first calibration value is a first voltage variation value $V_{cal, row}$, and the second calibration value is a second voltage variation value $V_{cal, col}$. The step S102 thus includes: determining a voltage of the unit cell 80 by a word signal voltage $V_{WL}$ and a bit signal voltage $V_{BL}$. The word signal voltage $V_{WL}$ is calibrated with the first calibration value $V_{cal, row}$, and the bit signal voltage $V_{BL}$ is calibrated with the second calibration value $V_{cal, col}$.

In the embodiments of FIG. 4, the voltage may be replaced by a current, that is, the first calibration value is a first current variation value, and the second calibration value is a second current variation value, and thus step S102 includes: determining a current of the unit cell 80 by a word signal current and a bit signal current. The word signal current is calibrated with the first calibration value, and the bit signal current is calibrated with the second calibration value.

The calibration of time, voltage, current described above are for exemplary purposes only, and not for limiting scope of the present invention, other programming conditions may also apply to the calibration method of the present invention.

Figure 9:
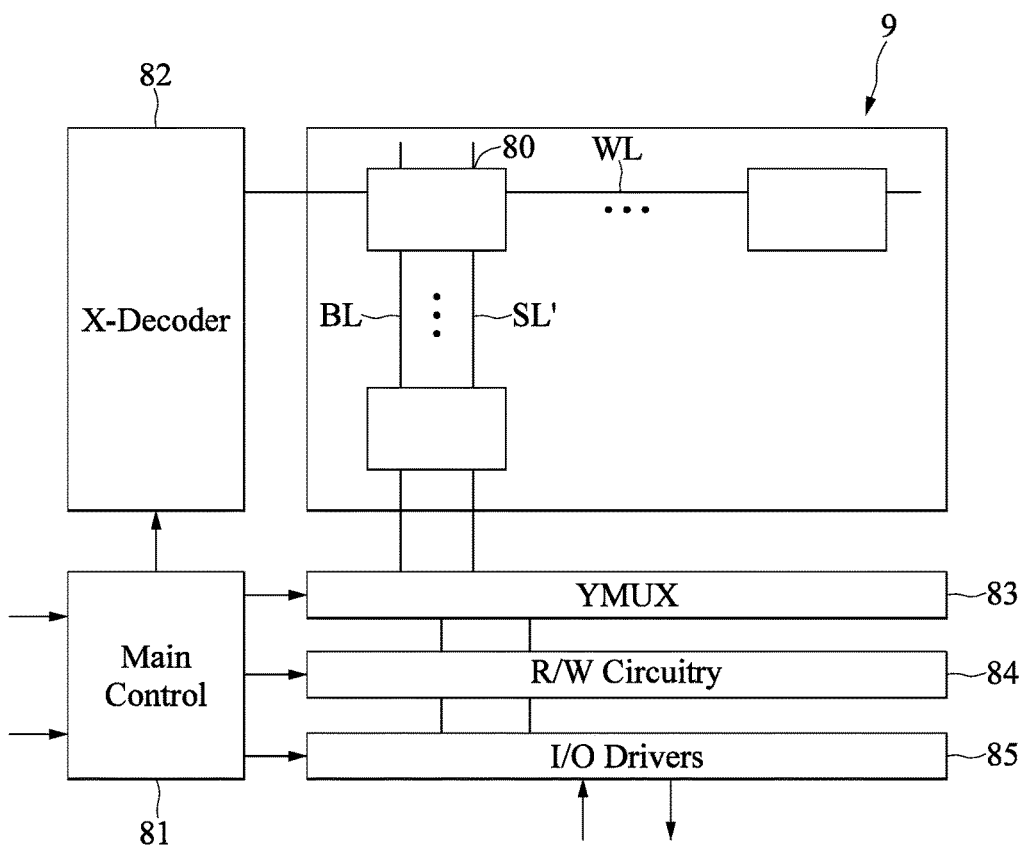
FIG. 9 shows a block diagram of a nonvolatile memory device according to another embodiment of the present invention.

Referring to FIG. 9, FIG. 9 shows a block diagram of a nonvolatile memory device 9 according to another embodiment of the present invention. The nonvolatile memory device 9 is mainly different from the nonvolatile memory device 8 in FIG. 8 in that a plurality of source lines SL in FIG. 8 is parallel to the word lines WL, while the source lines SL' in the nonvolatile memory device 9 is parallel to the bit lines BL, the word lines WL are perpendicular to the bit lines BL. In FIG. 8, the source lines SL may replace the word lines WL to be used together with the bit lines BL for calibration, and in FIG. 9, the source lines SL' may replace the bit lines WL to be used together with the bit lines BL for calibration. It should be noted that, as long as two sets of lines are perpendicular to each other and define the locations of the cell units, the two sets of lines may be used in the calibration method of the present invention. As mentioned above, the two sets of lines may be the bit lines and the word lines, the source lines and the bits lines, or the source lines and the word lines.

Furthermore, when the calibration method mentioned above is used to calibrate the cell units arranged in a 2-dimensional plane with two sets of lines, a third set of lines may also be added to extend from the 2-dimensional plane to a 3-dimensional structure. For example, if the bit lines and the word lines are used to calibrate the cell units arranged in the 2-dimensional plane, such as the x-y plane, the source lines may be used together to determine other planes of the cell units arranged along a third axis, such as the z axis, and the calibration method for cell units arranged in the 3-dimensional structure is thus achieved.

Therefore, the calibration method of the present invention through calibrating along both the column and row directions may provide more efficient and accurate adjustment for the optimal programming condition. In other words, the calibration method of each unit cell in a nonvolatile memory device is the combination of the calibration along the row and that along the column. Furthermore, the calibration method may also be extended to be applied in a memory device with cell units arranged in a 3-dimensional structure.

The aforementioned descriptions merely represent the preferred embodiments of the present disclosure, without any intention to limit the scope of the present disclosure which is fully described only within the following claims. Various equivalent changes, alterations or modifications based on the claims of the present disclosure are all, consequently, viewed as being embraced by the scope of the present disclosure.

What is claimed is:

1. A calibration method for a nonvolatile memory device having a plurality of unit cells, each of the unit cells corresponding to a word line and a bit line of the nonvolatile memory device, the method being performed on a non-transitory medium, the calibration method comprising:
   calibrating, by the word line, a word signal pulse of each of the word lines with a first calibration value corresponding to the word line;
   calibrating, by the bit line, a bit signal pulse of each of the bit lines with a second calibration value corresponding to the bit line; and
   calibrating each of the unit cells according to the word line and the bit line corresponding to the unit cell.

2. The calibration method of claim 1, wherein the first calibration value is a first time variation value, and the second calibration value is a second time variation value.

3. The calibration method of claim 2, wherein the step of calibrating each of the unit cells according to the word line and the bit line corresponding to the unit cell comprises:
   determining a start time of writing the unit cell by a start of the word signal pulse of the word line; and
   determining an end time of writing the unit cell by an end of the bit signal pulse of the bit line;
   wherein the start of the word signal pulse of the word line is calibrated by the first calibration value, and the end of the bit signal pulse of the bit line is calibrated by the second time variation value.

4. The calibration method of claim 2, wherein the step of calibrating each of the unit cells according to the word line and the bit line corresponding to the unit cell comprises:
   determining a start time of writing the unit cell by a start of the bit signal pulse of the bit line; and
   determining an end time of writing the unit cell by an end of the word signal pulse of the word line;
   wherein the start of the bit signal pulse of the bit line is calibrated by the first calibration value, and the end of the word signal pulse of the word line is calibrated by the second time variation value.

5. The calibration method of claim 1, wherein the first calibration value is a first voltage variation value, and the second calibration value is a second voltage variation value.

6. The calibration method of claim 5, wherein the step of calibrating each of the unit cells according to the word line and the bit line corresponding to the unit cell comprises:
   determining a voltage of the unit cell by a word signal voltage and a bit signal voltage;
   wherein the word signal voltage is calibrated with the first calibration value, and the bit signal voltage is calibrated with the second calibration value.

7. The calibration method of claim 1, wherein the first calibration value is a first current variation value, and the second calibration value is a second current variation value.

8. The calibration method of claim 5, wherein the step of calibrating each of the unit cells according to the word line and the bit line corresponding to the unit cell comprises:
   determining a current of the unit cell by a word signal current and a bit signal current;
   wherein the word signal current is calibrated with the first calibration value, and the bit signal current is calibrated with the second calibration value.

9. A nonvolatile memory device comprising a plurality of unit cells, each of the unit cells comprising:
a word line having a word signal pulse calibrated with a first calibration value corresponding to the word line; and
a bit line having a bit signal pulse calibrated with a second calibration value corresponding to the bit line;
wherein each of the unit cells is calibrated according to the word line and the bit line of the unit cell.

10. The nonvolatile memory device of claim 9, wherein the first calibration value is a first time variation value, and the second calibration value is a second time variation value.

11. The nonvolatile memory device of claim 10, wherein a start time of writing the unit cell is determined by a start of the word signal pulse of the word line, an end time of writing the unit cell is determined by an end of the bit signal pulse of the bit line, the start of the word signal pulse of the word line is calibrated by the first calibration value, and the end of the bit signal pulse of the bit line is calibrated by the second time variation value.

12. The nonvolatile memory device of claim 10, wherein a start time of writing the unit cell is determined by a start of the bit signal pulse of the bit line, an end time of writing the unit cell is determined by an end of the word signal pulse of the word line, the start of the bit signal pulse of the bit line is calibrated by the first calibration value, and the end of the word signal pulse of the word line is calibrated by the second time variation value.

13. The nonvolatile memory device of claim 9, wherein the first calibration value is a first voltage variation value, and the second calibration value is a second voltage variation value.

14. The nonvolatile memory device of claim 13, wherein a voltage of the unit cell is determined by a word signal voltage and a bit signal voltage, the word signal voltage is calibrated with the first calibration value, and the bit signal voltage is calibrated with the second calibration value.

15. The nonvolatile memory device of claim 9, wherein the first calibration value is a first current variation value, and the second calibration value is a second current variation value.

16. The nonvolatile memory device of claim 15, wherein a current of the unit cell is determined by a word signal current and a bit signal current, the word signal current is calibrated with the first calibration value, and the bit signal current is calibrated with the second calibration value.

* * * * *